(12) United States Patent
Okada et al.

(10) Patent No.: US 6,583,046 B1
(45) Date of Patent: Jun. 24, 2003

(54) POST-TREATMENT OF LOW-K DIELECTRIC FOR PREVENTION OF PHOTORESIST POISONING

(75) Inventors: Lynne A. Okada, Sunnyvale, CA (US); Fei Wang, San Jose, CA (US); Calvin T. Gabriel, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/903,757

(22) Filed: Jul. 13, 2001

(51) Int. Cl.[7] .......................................... H01L 21/4763
(52) U.S. Cl. ..................... 438/622; 438/672; 438/692
(58) Field of Search ................................ 438/622, 638, 438/672, 692, 738, 740

(56) References Cited

U.S. PATENT DOCUMENTS

| | | | |
|---|---|---|---|
| 3,988,823 A | 11/1976 | Hu | |
| 5,084,419 A | 1/1992 | Sakao | |
| 5,643,407 A * | 7/1997 | Chang | 156/644.1 |
| 5,767,582 A * | 6/1998 | Lee et al. | 257/753 |
| 5,770,345 A | 6/1998 | Babich et al. | |
| 5,891,803 A * | 4/1999 | Gardner | 438/660 |
| 6,013,579 A | 1/2000 | Wang et al. | |
| 6,051,484 A | 4/2000 | Morizuka | |
| 6,080,655 A * | 6/2000 | Givens et al. | 438/626 |
| 6,087,724 A | 7/2000 | Shields et al. | |
| 6,103,456 A | 8/2000 | Többen et al. | |
| 6,114,766 A | 9/2000 | Shields | |
| 6,204,202 B1 * | 3/2001 | Leung et al. | 438/781 |
| 6,207,577 B1 * | 3/2001 | Wang et al. | 438/706 |
| 6,284,657 B1 * | 9/2001 | Chooi et al. | 438/687 |
| 6,319,809 B1 | 11/2001 | Chang et al. | |
| 6,323,121 B1 | 11/2001 | Liu et al. | |

* cited by examiner

*Primary Examiner*—Amir Zarabian
*Assistant Examiner*—Pamela E Perkins

(57) ABSTRACT

Deleterious poisoning of patterned photoresist masking layers accompanying plasma ashing/etching of photoresist and/or low-k dielectric layers in a nitrogen-containing atmosphere is eliminated, or at least substantially reduced, by post-treating exposed surfaces of the low-k dielectric layer(s) with hydrogen, e.g. by contact with $H_2$ gas at an elevated temperature or with a $H_2$ plasma subsequent to plasma ashing/etching. The invention enjoys particular utility in the formation of dual damascene openings in dielectric layers as part of metallization processing of semiconductor IC devices.

26 Claims, 3 Drawing Sheets

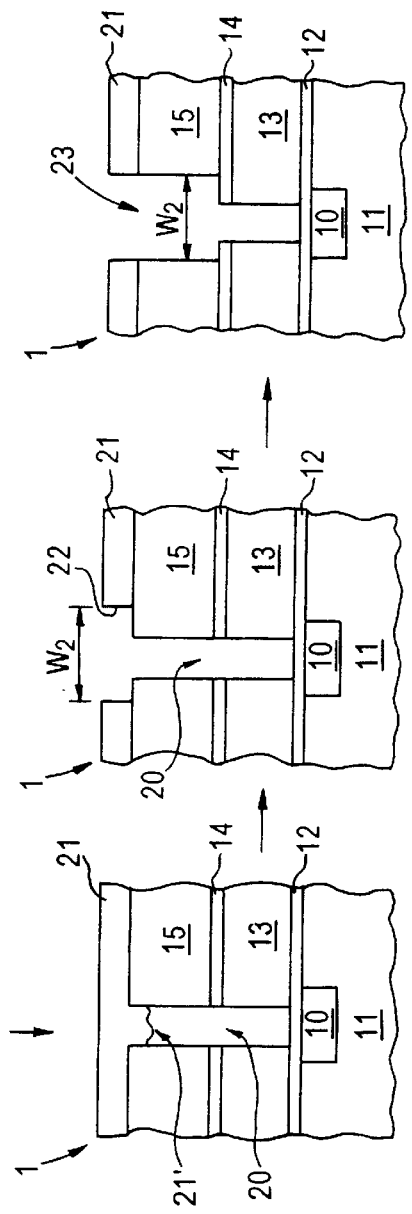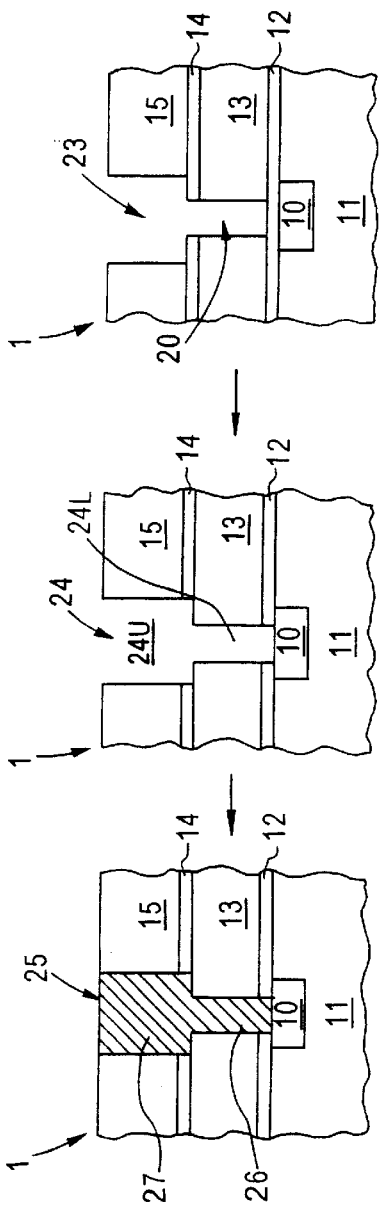

US 6,583,046 B1

POST-TREATMENT OF LOW-K DIELECTRIC FOR PREVENTION OF PHOTORESIST POISONING

CROSS-REFERENCE TO RELATED APPLICATION

This application contains matter similar to subject matter contained in U.S. patent application Ser. No. 09/903,758, filed on Jul. 13, 2001.

FIELD OF THE INVENTION

The present invention relates to a method for preventing poisoning of photoresist materials during patterning of low dielectric constant ("low-k") materials which contain at least one constituent which can cause photoresist poisoning, such as nitrogen, or where the patterning process utilizes a nitrogen-based etching/ashing chemistry. The invention has particular applicability in the manufacture of high integration density, multi-metallization level semiconductor devices comprising accurately formed, sub-micron dimensioned features and interconnection patterns while exhibiting high circuit speeds due to reduced capacitance loading.

BACKGROUND OF THE INVENTION

The escalating requirements for high integration density and performance associated with ultra-large scale ("ULSI") integration semiconductor device wiring and interconnection patterns are difficult to satisfy in terms of providing accurately dimensioned, sub-micron sized features (e.g., 0.18 µm and below, such as 0.15 µm and below). Moreover, interconnection technology is being constantly challenged to satisfy the ever-increasing requirements for high performance (e.g., circuit speed) associated with such ULSI devices. The circuit speed of such integrated circuit ("IC") devices varies inversely with the product of the resistance and capacitance of the interconnection system, i.e., the "RC product". Thus, the higher the value of the RC product, the more limiting the circuit speed, and, as IC devices become more complex, with smaller feature sizes and spacings, the circuit speed becomes less dependent upon the component transistors, etc., and more dependent upon the interconnection pattern. As a consequence of the effect of the RC product upon circuit speed, at deep sub-micron regimes, e.g., less than about 0.12 µm, the performance of multi-level interconnection patterns and systems becomes dominated by the interconnect capacitance. As a further consequence, the rejection rate of IC devices due to circuit speed delays arising from RC effects has become a limiting factor in IC fabrication.

Conventional semiconductor IC devices typically comprise a semiconductor substrate, such as a doped monocrystalline silicon (Si) wafer including a plurality of active device regions, e.g., transistors, formed therein or thereon, and a plurality of overlying, sequentially formed interlayer dielectrics ("ILD"s) and electrically conductive patterns, e.g., of metal. An IC is formed therefrom containing a plurality of electrically conductive patterns comprising conductive lines separated by interwiring spaces, and a plurality of interconnect lines, such as bus lines, bit lines, word lines, and logic interconnect lines. Typically, the conductive patterns of different layers, i.e., upper and lower vertically spaced-apart layers, are electrically connected by a conductive plug filling a via opening, while a conductive plug filling a contact opening establishes an electrical contact with an active device region on or within the semiconductor substrate, such as a source or drain region of a transistor. Conductive lines are formed in trenches which typically extend substantially horizontally with respect to the semiconductor substrate. Semiconductor devices comprising five (5) or more levels of vertically interconnected metallization are becoming more prevalent as device geometries and feature sizes decrease into the deep sub-micron range.

In fabricating multi-metallization level devices such as described above, conductive plugs filling via openings for electrically interconnecting vertically spaced-apart metallization levels are typically formed by a process sequence comprising steps of: (1) depositing an inter-layer dielectric (ILD) on a patterned, electrically conductive layer, e.g., a metal layer comprising at least one metal feature; (2) forming a desired opening in the ILD, as by means of photolithographic masking and etching techniques, and filling the opening with a plug of an electrically conductive material, e.g., tungsten (W); and (3) removing excess conductive material deposited on the surface of the ILD during filling of the opening, as by chemical-mechanical polishing/planarization ("CMP").

A commonly employed method for fabricating such electrically conductive vias for interconnecting vertically spaced-apart metallization levels is termed "damascene" processing and, in essence, involves the formation of an opening in the ILD which is filled with the plug of electrically conductive material. "Dual-damascene" processing techniques involve formation of an opening in an ILD which comprises a lower, narrower width contact or via opening section which communicates with an upper, wider trench opening section, followed by simultaneous filling of both the lower and upper sections of the opening with an electrically conductive material, typically a metal or metallic material, to simultaneously form a conductive via plug in integral communication with a conductive line.

As described above, the drive toward manufacture of ULSI semiconductor devices having decreased circuit and feature sizes well into the deep sub-micron range has necessitated a reduction in the RC product of the metallization systems. Thus, in an effort to reduce interconnect capacitance, dielectric materials having very low values of dielectric constant (permittivity) have been developed for use as ILD's in IC metallization systems formed by, e.g., the above-described damascene techniques. As compared with dielectric materials heretofore utilized as ILD's and having values of dielectric constant ("k") in the range of from about 3.9 for dense silicon dioxide ($SiO_2$) to greater than about 8 for deposited silicon nitride ($Si_xN_y$), these newer "low-k" dielectric materials are characterized by values of dielectric constant k which are less than about 3.9, e.g., about 3.5 or below (where the value of k is one (1) for a vacuum).

One type of low-k material that has been extensively studied for use as ILD's in metallization processing are flowable oxides which are, in essence, ceramic polymers, such as, for example, hydrogen silsesquioxane ("HSQ"). Such materials have been considered for use as "gap-fill" between spaced-apart metal lines in view of their flowability and ability to fill very small openings. Other possible low-k ILD materials with k values from about 2.0 to about 3.8 include FLARE 2.0™, a poly(arylene)ether (available from Advanced Microelectronic Materials Division, Allied-Signal, Sunnyvale, Calif.); Black Diamond ™ (available from Applied Materials, Santa Clara, Calif.); BCB (divinylsiloxane bis-benzocyclobutene), $FO_x$,™ (HSQ-based), XLK™ (HSQ-based), and SiLK™, an aromatic hydrocarbon polymer (each available from Dow Chemical Co., Midland, Mich.); Coral™, a carbon-doped silicon oxide (available from Novellus Systems, San Jose, Calif.);

HOSP™, a hybrid siloxane-organic polymer, and Nanoglass™, a nanoporous silica (each available from Honeywell Electronic Materials); and halogen-doped (e.g., fluorine-doped) silicon dioxide derived from tetraethyl orthosilicate (TEOS) and fluorine-doped silicate glass (FSG).

A drawback associated with the use of the above-described damascene technology for forming sub-micron dimensioned in-laid metallization patterns and features, particularly in the case of "via first-trench last" type dual-damascene processing, arises from a phenomenon known as "photoresist poisoning", wherein a relatively narrow via opening is formed to extend completely through at least one ILD in a first anisotropic etching process utilizing a first patterned photoresist, and a relatively wide trench opening is formed in an upper portion of the via opening in a second anisotropic etching process utilizing a second patterned photoresist. According to such processing methodology, there is a tendency for contaminated photoresist material of the second photoresist utilized for trench opening formation to remain within the via opening in the at least one ILD after development and patterning of the second photoresist for trench mask formation for use in subsequent trench etching. The remaining contaminated photoresist may form a mushroom-shaped cap extending over only the mouth of the opening, or the contaminated photoresist may also at least partially fill the opening. In either instance, the remaining contaminated photoresist can adversely impact the dimensional accuracy of the subsequently formed trench, as will be explained below. Photoresist poisoning leading to loss of dimensional accuracy and control is particularly problematic when low-k dielectrics, such as are enumerated above, are utilized for the at least one ILD in via first-trench last dual-damascene processing.

FIG. 1 illustrates the above-described phenomenon, in which a semiconductor IC device structure 1 includes a lower metal feature 10, such as of copper (Cu) or Cu-based alloy, formed in a dielectric layer 11 overlying a semiconductor substrate (not shown in the figure for illustrative simplicity), typically a doped monocrystalline Si wafer including at least one active device or region formed thereon or therein, and a protective capping layer 12, such as of a silicon nitride, is formed thereon. A laminate comprising, in sequence from the capping layer 12, a first, or lower, low-k dielectric (ILD) layer 13, a middle etch stop layer 14, and a second, or upper, low-k dielectric (ILD) layer 15 is then formed over the capping layer 12. According to the via first-trench last processing sequence, a relatively narrow via opening or hole 16 is then formed to extend through the second, or upper ILD 15, the middle etch stop layer 14, and first, or lower ILD 13, terminating at the capping layer 12, by means of a first anisotropic etching process (typically reactive plasma etching) utilizing a first patterned photoresist layer as an etch mask and a first etch chemistry. The first patterned photoresist layer is then removed, for example, by a plasma ashing process utilizing an oxygen ($O_2$) or nitrogen ($N_2$) plasma. A second photoresist layer 17 is then formed over the second, or upper ILD 15, a portion of which is included within the via opening or hole 16. Photolithographic patterning of the second photoresist layer 17, including selective radiation exposure, development, and etching, is then performed to effect selective removal of photoresist portion 17A shown in phantom. However, due to the above-mentioned photoresist poisoning phenomenon, contaminated photoresist material 17B having a mushroom-shaped upper or cap portion 17C may remain within at least the upper part of the via opening or hole 16 and covering the portion of the second, or upper ILD 15 surrounding the perimeter of the mouth of the via opening or hole 16. As a consequence of the presence of the mushroom-shaped cap portion 17C partially overlying the upper surface of the second, or upper ILD 15, the subsequent anisotropic, reactive plasma etching process terminating at the middle, etch stop layer 14 for forming the trench may lead to poor transference of the desired pattern of the photoresist layer 17 to the upper ILD 15.

The generally accepted mechanism for occurrence of photoresist poisoning leading to mushroom-shaped via cap formation is as follows: during photolithographic patterning of the photoresist layer to form a mask pattern therein, a pattern of incident light or radiation from a radiation source travels through the photo-reactive polymeric material of the photoresist ("PR") layer and is progressively absorbed as it photo-initiates reaction in the pattern of exposed areas. Contaminants which are incompatible with the photo-reactive polymer material can migrate into the photoresist layer from a bordering layer or enter the photoresist layer by other means and poison the photoresist material. For example, the contaminants can undergo interfering reactions with the photoresist material, causing non-uniformity of the photo-reaction therein by extraneous chemical reaction with the polymeric material. This phenomenon is known as photoresist poisoning and can lead to the formation of, e.g., the mushroom-shaped cap 17C overlying the mouth of the narrow width via opening or hole 16, as well as a portion of the upper surface of the upper ILD 15 surrounding the perimeter of the via opening or hole. In addition, the patterned areas of the photoresist layer may have non-uniform (i.e., non-vertical) sidewalls. In either case, subsequent etching utilizing such photoresist patterns as etch masks leads to imperfect transfer of the photoresist pattern to the underlying ILD layer(s), and ultimately limits the minimum spatial resolution since the etched structure is imprecise compared to the desired IC design.

Experimentation and investigation has determined that the most likely cause of photoresist poisoning associated with the use of low-k ILD's, e.g., as in the above-described via first-trench last, dual-damascene processing for forming metallization patterns of ULSI semiconductor devices, is migration of reactive nitrogenous species from the low-k ILD materials (i.e., layers 13 and 15 in FIG. 1) into the layer (17) of photoresist material utilized for forming the trench, which nitrogenous species reacts therewith causing non-uniformity of the photo-initiated reaction by extraneous chemical interaction with the polymeric photoresist material. Further studies have suggested that the reactive nitrogenous species migrating from the ILD's 13 and/or 15 is (are) derived from the low-k dielectric material(s) per se and/or from the introduction of nitrogenous species into such low k dielectric material(s) during steps of etching for formation of the via opening or hole 16 and/or for removal of the photoresist mask utilized in forming the via hole or opening 16, either or both of which steps may utilize a nitrogen-based or nitrogen-containing etching chemistry. (As employed in the specification and appended claims, the term "reactive nitrogenous species" contemplates reactive nitrogen-containing substances including both nitrogen itself and attendant self-generating contaminant compounds thereof with other contaminating precursor constituents such as hydrogen, i.e., reactive nitrogen-containing contaminant compounds).

As design rules extend further into the sub-micron range, e.g., about 0.18 $\mu$m and below, such as 0.15 $\mu$m and below, for example, 0.12 $\mu$m, and the number of metallization levels increases, necessitating a corresponding increase in the number of photoresist mask patterning and etching steps for forming recesses in low-k ILD's, such as via openings, trenches, grooves, etc., maintenance of the critical feature sizes or dimensions of the metallization/interconnect pattern becomes increasingly important. Accordingly, the problem of photoresist poisoning resulting from contamination thereof with reactive species, originating either from the ILD material per se or from the etching/ashing chemistry utilized in via etching and/or photoresist removal, and resulting in the loss of desired metallization feature sizes, dimensions, and/or geometries, requires resolution.

Thus, there exists a need for methodology enabling the formation of sub-micron-dimensioned metal vias, contacts, interconnection and routing members, etc., having desired features sizes, dimensions, and geometries with high reliability and performance, and at high product yield. Specifically, there exists a need for methodology for eliminating the problem of loss of desired feature dimensions due to photoresist poisoning associated with mask patterning of photoresists layers overlying or in the vicinity of low-k dielectric material layers, e.g., ILD's forming part of a multi-level metallization system of ULSI semiconductor devices, which methodology is rapid, cost-effective, and avoids the drawbacks and disadvantages associated with the conventional patterning techniques.

The present invention, wherein the interior wall surfaces of an opening formed in at least one low-k ILD, e.g., a via opening or hole, are subjected to a post-treatment in a hydrogen ($H_2$)-containing atmosphere for eliminating, or at least substantially reducing, the amount of nitrogenous species migrating therefrom into the photoresist layer, e.g., a thermal or plasma treatment, subsequent to plasma ashing removal of the patterned photoresist utilized for formation of the via opening or hole, effectively addresses and solves the need for improved methodology for forming sub-micron-dimensioned recesses in low-k dielectric layers, e.g., ILD's. Further, the methodology provided by the present invention can be readily and easily implemented in cost-effective manner utilizing conventional thermal or plasma treatment apparatus. Finally, the methodology afforded by the present invention enjoys diverse utility in the manufacture of numerous and various types of semiconductor devices and/or components.

DISCLOSURE OF THE INVENTION

An advantage of the present invention is a method for eliminating, or at least substantially reducing, photoresist poisoning during recess patterning of a material.

Another advantage of the present invention is a method for eliminating, or at least substantially reducing, photoresist poisoning during recess patterning of a low-k dielectric material for use in multi-level metallization processing of high integration density semiconductor IC devices.

Still another advantage of the present invention is a method of manufacturing a semiconductor device which eliminates, or substantially reduces photoresist poisoning during recess patterning of low-k dielectric layers forming part of a multi-level metallization system of such device.

Additional advantages and other features of the present invention will be set forth in the description which follows and in part will become apparent to those having ordinary skill in the art upon examination of the following or may be learned from the practice of the invention. The advantages of the present invention may be realized as particularly pointed out in the appended claims.

According to an aspect of the present invention, the foregoing and other advantages are obtained in part by a method of eliminating, or at least substantially reducing, photoresist poisoning during recess patterning of a layer of a material, comprising the sequential steps of:

(a) forming a first photoresist layer on an upper surface of the layer;

(b) patterning the first photoresist layer to include at least one opening therein having a first width;

(c) forming at least one first recess in the upper surface of the layer utilizing the patterned first photoresist layer as a mask, the at least one first recess having a first width substantially corresponding to the first width of the at least one opening in the first photoresist layer and extending for a first depth below the surface of the layer;

(d) removing the first photoresist layer;

(e) treating exposed surfaces of the layer to eliminate, or at least substantially reduce the amount of, at least one contaminant or constituent thereof which can poison a second photoresist layer subsequently formed in contact with the upper surface of the layer; and (f) forming a second photoresist layer on the upper surface of the layer;

wherein poisoning of the second photoresist layer by entry thereinto of the at least one contaminant or constituent of the layer is eliminated or at least substantially reduced due to the surface treating of step (e).

According to an embodiment of the present invention, the method comprises the further steps of:

(g) patterning the second photoresist layer to form at least one opening therein, the at least one opening in the second photoresist layer being vertically aligned with the at least one first recess in the layer and having a second width greater than the first width; and (h) forming at least one second recess in an upper portion of said layer utilizing the second patterned photoresist layer as a mask, the at least one second recess having a second width substantially corresponding to the second, greater width of the at least one opening in the second photoresist layer, the at least one second recess communicating with the at least one first recess and extending for a second depth below the surface of the layer, the second depth being less than the first depth.

In accordance with embodiments of the present invention, step (a) comprises forming the first photoresist layer on the surface of a layer comprised of at least one low-k dielectric material having a dielectric constant less than about 3.9, which dielectric layer may be comprised of a laminate of layers of low-k dielectric materials.

According to embodiments of the present invention, step (a) comprises forming the first photoresist layer on the surface of a laminate of layers each comprised of a low-k dielectric material selected from the group consisting of hydrogen silsesquioxane-based ceramic polymers, poly (arylene) ether-based organic polymers. benzocyclobutene-based materials, aromatic hydrocarbon-based polymers, carbon-doped silicon oxide, hybrid siloxane-organic polymers, nanoporous silica, halogen doped silicon dioxides obtained from tetraethyl orthosilicate, and fluorine-doped silica glasses.

In accordance with embodiments of the present invention, step (c) comprises forming the at least one first recess in the upper surface of the layer by an anisotropic etching process, e.g., anisotropic etching utilizing a reactive plasma; step (d) comprises removing the first photoresist layer by plasma ashing in a nitrogen-containing atmosphere; and step (e) comprises treating the exposed surfaces of the layer with hydrogen, e.g., by contacting the exposed surfaces with hydrogen ($H_2$) gas at an elevated temperature or with a hydrogen plasma.

According to embodiments of the present invention, step (h) comprises forming the at least one second recess in the upper portion of the layer by an anisotropic etching process, e.g., reactive plasma etching, utilizing the patterned second photoresist layer as a mask, the etching terminating at an etch stop layer within the layer at the second depth below the surface.

According to another aspect of the present invention, a method of manufacturing a semiconductor device comprises the sequential steps of:

(a) providing a workpiece comprising:
   (i) a semiconductor substrate including at least one active device region or component formed therein or thereon;
   (ii) a dielectric layer overlying the semiconductor substrate and including at least one metal feature in-laid in an upper surface of the dielectric layer;
   (iii) a thin capping layer formed over at least the upper surface of the at least one metal feature; and
   (iv) an interlayer dielectric layer formed over the thin capping layer;

(b) forming a first photoresist layer on an upper surface of the interlayer dielectric layer;

(c) patterning the first photoresist layer to include at least one opening therein having a first width;

(d) forming at least one first recess in the upper surface of the interlayer dielectric layer utilizing the patterned first photoresist layer as a mask, the at least one first recess having a first width substantially corresponding to the first width of the at least one opening in the first photoresist layer and extending through the interlayer dielectric layer to the thin capping layer;

(e) removing the first photoresist layer;

(f) treating exposed surfaces of the interlayer dielectric layer to eliminate, or at least substantially reduce the amount of, at least one contaminant or constituent thereof which can poison a second photoresist layer subsequently formed on the upper surface of the interlayer dielectric layer;

(g) forming a second photoresist layer on the upper surface of the interlayer dielectric layer;

(h) patterning the second photoresist layer to form at least one opening therein, the at least one opening in the second photoresist layer being vertically aligned with the at least one first recess and having a second width greater than the first width; and (i) forming at least one second recess extending partway through the interlayer dielectric layer, the second recess having a second width substantially corresponding to the second, greater width of the at least one opening in the second photoresist layer and communicating with the at least one first recess.

According to embodiments of the present invention, step (a) comprises providing a workpiece wherein the interlayer dielectric layer (iv) further includes:

($iv_1$) a first, lower interlayer dielectric layer formed over the thin capping layer;

($iv_2$) a thin etch stop layer formed over the first interlayer dielectric layer; and ($iv_3$) a second, upper interlayer dielectric layer formed over the thin etch stop layer.

In accordance with embodiments of the present invention, each of the first, lower and second, upper interlayer dielectric layers comprises a low-k dielectric material having a dielectric constant less than about 3.9 and is selected from the group consisting of hydrogen silsesquioxane-based ceramic polymers, poly(arylene) ether-based organic polymers, benzocyclobutene-based materials, aromatic hydrocarbon-based polymers, carbon-doped silicon oxide, hybrid siloxane-organic polymers, nanoporous silica, halogen-doped silicon dioxides obtained from tetraethyl orthosilicate, and fluorine-doped silica glasses;

step (e) comprises removing the first photoresist layer by plasma ashing in a nitrogen-containing atmosphere; and step (f) comprises treating the exposed surfaces of the first and second interlayer dielectric layers to eliminate, or at least substantially reduce the amount of nitrogen thereon or thereat by contacting the surfaces with hydrogen ($H_2$) gas at an elevated temperature or with a hydrogen plasma.

In accordance with embodiments of the present invention, step (d) comprises anisotropic etching utilizing a reactive plasma; and step (i) comprises anisotropic etching utilizing a reactive plasma and terminating etching of the at least one second recess at the thin etch stop layer.

According to further embodiments of the present invention, the method further comprises the steps of:

(j) removing the second photoresist layer;

(k) removing the thin capping layer overlying the upper surface of the at least one in-laid metal feature at the bottom of the at least one first recess; and (l) filling the at least one first and the at least one second communicating recesses with a metal plug to form at least one electrically conductive via in contact with the at least one in-laid metal feature and at least one electrically conductive line in contact with the at least one electrically conductive via.

In accordance with a particular embodiment of the present invention, step (a) comprises providing a workpiece wherein the semiconductor substrate comprises silicon (Si), the at least one inlaid metal feature comprises copper (Cu) or a Cu-based alloy, and the thin capping layer comprises a silicon nitride or oxynitride.

Additional advantages and aspects of the present invention will become apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

DESCRIPTION OF THE DRAWINGS

The following detailed description of the embodiments of the present invention can best be understood when read in conjunction with the following drawings, in which the relevant features are not necessarily drawn to scale but rather are drawn as to best illustrate the pertinent features, and in which like reference numerals arc employed throughout to designate similar features, wherein:

FIGS. 2(A)–2(L) illustrate, in simplified, cross-sectional, schematic form, sequential steps in performing a dual-damascene metallization process according to the present invention.

DESCRIPTION OF THE INVENTION

Figure 1:
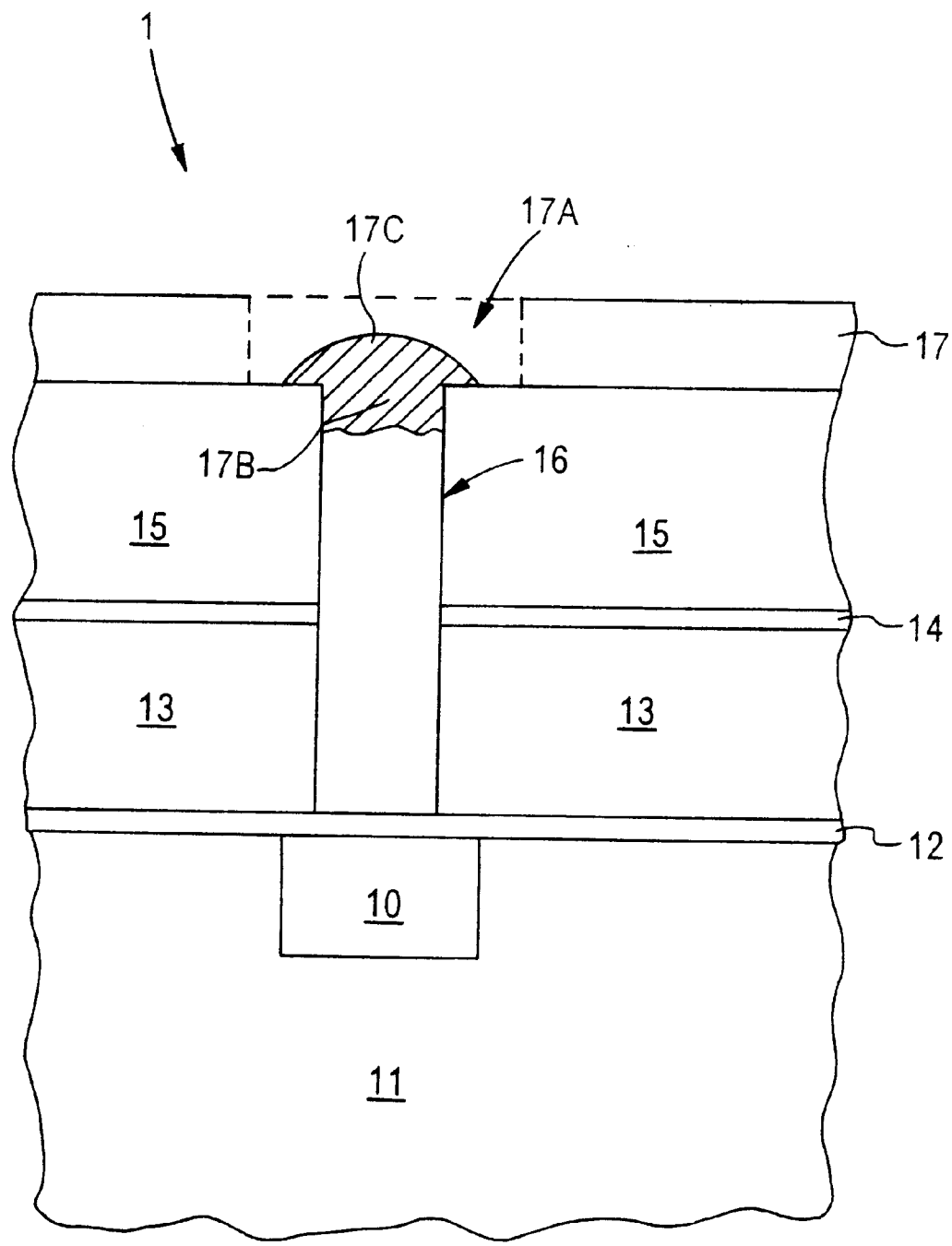
FIG. 1 illustrates, in simplified, cross-sectional, schematic form, a photoresist poisoning problem addressed and solved by the present invention.

The present invention is based upon the discovery that deleterious poisoning of patterned photoresist masking layers leading to loss of dimensional replication and accuracy which can result from photoresist contamination due to prior patterning/removal processing utilizing plasma etching/ashing techniques, which frequently occurs when low-k dielectric layers are subjected to recess patterning, can be substantially avoided, or at least minimized, by appropriate post-treatment of exposed surfaces of the low-k dielectric layer(s) subsequent to performing plasma ashing/etching techniques. The inventive methodology is of particular utility when the photoresist poisoning is associated with the use of low-k dielectric materials containing nitrogen as a constituent element and/or when reactive plasma ashing/etching of structures comprised of such low-k materials is performed utilizing nitrogen-based etching/ashing chemistries. According to the invention, post-treatment of the exposed surfaces of the low-k dielectric layer(s) comprises contact with hydrogen, e.g., by contact with $H_2$ gas at an elevated temperature or with a hydrogen-containing plasma.

A key feature, i.e., advantage, of the present invention when utilized as part of dual-damascene "back-end" metallization processing of multi-metallization level high integration density semiconductor devices, is the substantial elimination of the formation of mushroom-shaped caps of contaminated, i.e., "poisoned" photoresist over high aspect ratio recesses formed in dielectric layers initially formed during dual-damascene processing for creating via openings, which cap formation can lead to an undesirable loss in replication of the mask pattern and poor dimensional accuracy of the metallization features. According to the invention, the post-treatment of the exposed surfaces of the low-k dielectric material subsequent to plasma ashing for removal of an earlier-employed photoresist layer: (1) reduces the amount of nitrogen or nitrogen-containing contaminants at the exposed surfaces of the low-k dielectric layer(s) which can poison a subsequently deposited photoresist layer and hinder accurate patterning thereof; and (2) introduces an amount of hydrogen atoms at the exposed surfaces of the low-k dielectric layer(s), which hydrogen atoms can react with nitrogen atoms/molecules introduced during a previously conducted reactive ashing/etching step to form effectively harmless, volatile species, e.g., water ($H_2O$) vapor and ammonia ($NH_3$) gas which are readily removed from the vicinity of the exposed surfaces. As a consequence of the inventive methodology, high-quality, multi-metallization level semiconductor IC devices can be readily and cost-effectively fabricated utilizing otherwise conventional processing methodologies and instrumentalities. Further, while the inventive methodology is especially suited for use in dual-damascene processing, the invention is applicable to all manner of workpiece processing wherein patterned photoresist layers are employed for recess formation in a substrate.

Referring now to FIGS. 2(A)–2(L), shown therein are simplified, cross-sectional, schematic views illustrating a sequence of steps utilized in performing a dual-damascene metallization process according to the present invention. In a first step, shown in FIG. 2(A), a workpiece or precursor structure 1 for a semiconductor IC device is provided, which precursor structure essentially corresponds to that of FIG. (1), and includes a lower metal feature 10, such as a copper (Cu) or Cu alloy-based contact or interconnect, routing, or bus line, in-laid in the upper surface of a dielectric layer 11, which dielectric layer in turn overlies a semiconductor substrate (not shown in the drawing figures for illustrative simplicity), typically a doped monocrystalline silicon (Si) or gallium arsenide (GaAs) wafer including at least one active device region, e.g., a source or drain region of a transistor, formed therein or thereon. A thin capping layer 12 is formed over at least the upper surface of lower metal feature 10 for protecting the metal feature from deleterious reaction, etc., during recess patterning, and typically comprises a silicon nitride layer from about 100 to about 500 Å thick, preferably about 300Å thick, when lower metal feature 10 is comprised of Cu or a Cu-based alloy. Precursor structure 1 further includes a laminate of layers, comprising, in sequence from the capping layer 12, a first, or lower, low-k interlayer dielectric layer 13 typically from about 2,000 to about 5,000 Å thick, preferably about 3,500 Å thick, and comprised of at least one of the aforementioned low-k dielectric materials; a middle etch stop layer 14, typically comprised of a silicon nitride layer from about 100 to about 500 Å thick, preferably about 300 Å thick; and a second, or upper, low-k interlayer dielectric layer 15 typically from about 2,000 to about 5,000 Å thick, preferably about 3,500 Å thick, also comprised of at least one of the aforementioned low-k dielectric materials. It is also within the ambit of the present invention to utilize a workpiece structure having a single low-k interlayer dielectric layer (without middle etch stop layer 14), in place of the illustrated lower dielectric layer/etch stop layer/upper dielectric layer laminate. In addition, either of the aforementioned single or multiple dielectric structures can be covered by a suitable capping layer, such as of a silicon oxynitride.

According to the illustrated embodiment, metallization processing of workpiece or device precursor structure 1 is performed utilizing a dual-damascene, via first-trench last processing sequence, as follows: adverting to FIGS. 2(B)–2(C), a first photoresist layer 18 is formed on the upper surface of the second, upper dielectric layer 15 and then patterned, as by conventional techniques not described herein for brevity, to include at least one opening 19 therein in vertical registry with lower metal feature 10, opening 19 having a relatively narrow first width $w_1$ corresponding to the width of a via opening to be next formed in the laminate, $w_1$ typically being from about 0.07 to about 0.35 μm wide, preferably about 0.15 μm wide.

Figures 2A, 2B, 2C, 2D, 2E, 2F:
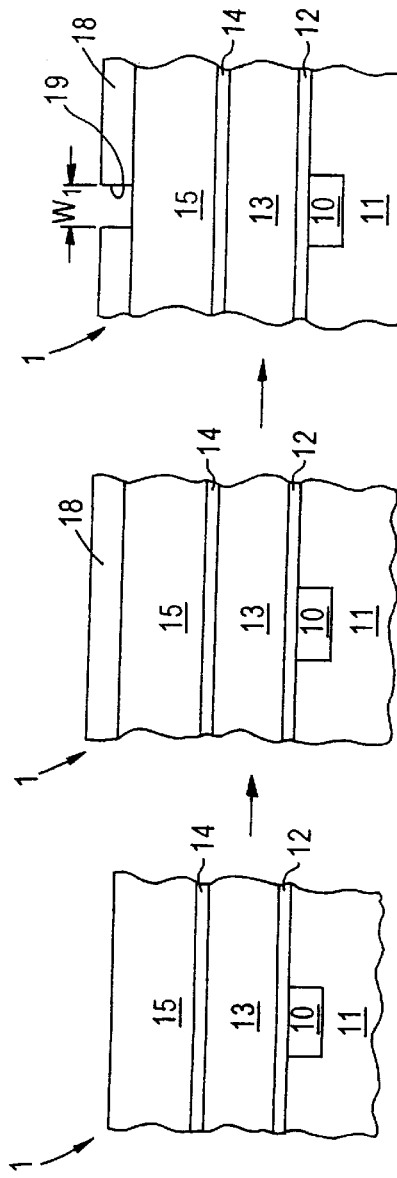

In the next step, shown in FIG. 2(D), at least one first recess 20, e.g., a via opening, is formed, as by a reactive plasma etching process utilizing $C_4F_8/O_2/Ar$, to extend through each of the first, or upper interlayer dielectric layer 15, the middle etch stop layer 14, and second, or lower interlayer dielectric layer 13, terminating at the capping layer 12 overlying lower metal feature 10.

According to the next step of the process, shown in FIG. 2(E), the thus-formed precursor structure 1 is subjected to a plasma ashing process for removal of the first photoresist layer 18, e.g., plasma ashing utilizing a nitrogen ($N_2$) or oxygen ($O_2$) plasma at a pressure of from about 200 to about 1,000 mTorr, preferably about 400 mTorr; temperature of from about 0 to about 50° C., preferably about 25° C.; and power (RF) of from about 100 to about 1,000 W, preferably about 500 W; for from about 15 to about 180 sec., preferably about 100 sec.

Referring now to FIG. 2(F), the workpiece or precursor structure 1 with the at least one first recess 20 formed in the laminate of low-k interlayer dielectric layers, which at least one first recess includes exposed interior wall surfaces of each of the first and second low-k interlayer dielectric layers 13 and 15, respectively, is subjected to a post-treatment with hydrogen for: (1) reducing the amount of nitrogen atoms/molecules present at the interior wall surfaces (either as a constituent of the low-k dielectric material or as a contaminant thereof resulting from plasma processing); and (2) introducing an amount of hydrogen at the interior wall surfaces. The hydrogen post-treatment may comprise an annealing treatment comprising contacting the exposed interior wall surfaces of the at least one first recess 20 with a hydrogen ($H_2$) gas atmosphere at an elevated temperature, e.g., at from about 25 to about 450° C., preferably about 350° C., for from about 10 to about 120 sec., preferably about 30 sec., or with a hydrogen plasma, e.g., at a pressure of from about 20 to about 1,000 mTorr, preferably about 500 mTorr; temperature of from about 0 to about 80° C., preferably about 25° C.; and power (RF) of from about 100 to about 1,700 W, preferably about 500 W; for from about 5 to about 60 sec., preferably about 20 sec.

Referring now to FIGS. 2(G)–2(H), a second photoresist layer 21 is formed on the upper surface of the second, upper dielectric layer 15 and then patterned, as by use of conventional techniques not described herein for brevity, to include at least one opening 22 therein in vertical registry with the first, or via recess or opening 20 extending through the laminate of upper and lower low-k interlayer dielectric layers, opening 22 having a relatively wide second width $w_2$ corresponding to the width of a trench recess portion or opening to be next formed in the laminate, $w_2$ typically being from about 0.07 to about 0.35 μm wide, preferably about 0.15 μm wide. Advantageously, according to the invention, poisoning of portion 21' of the second photoresist layer 21 filling the upper portion of via opening 20 (see FIG. 2(G)) due to nitrogen originating from the exposed interior wall surfaces of the via opening is eliminated, or at least substantially reduced vis-à-vis conventional processing schemes for forming dual-damascene openings in low-k dielectric layers, by virtue of the hydrogen post-treatment step of FIG. 2(F). As a consequence, an advantage provided by the inventive methodology is complete removal of all desired portions of the second photoresist layer 21 for patterning thereof, which removal is readily accomplished by means of conventional photoresist patterning techniques.

In the next step according to the invention, shown in FIG. 2(I), at least one second recess 23, e.g., a trench portion, is formed, as by a reactive plasma etching process utilizing $C_4F_8O_2$/Ar, to extend through the second, or upper low-k interlayer dielectric layer 15 and terminate at the middle etch stop layer 14, the trench portion 23 having a width substantially corresponding to width $w_2$. In the event a single low-k interlayer dielectric layer is employed in place of the illustrated laminate of low-k interlayer dielectric layers, a timed etch not requiring an etch stop layer may be utilized to form trench portion 23 extending only partway through the single low-k interlayer dielectric layer.

Adverting to FIGS. 2(J)–2(K), subsequent processing includes removal of the second photoresist layer 21, as by plasma ashing techniques similar to those utilized for removal of the first photoresist layer 18. and capping layer 12 of, e.g., a silicon oxynitride, is removed by plasma etching utilizing $CHF_3/N_2$/Ar, to form a dual-damascene opening 24 having a relatively narrow lower, or via portion $24_L$ communicating with a relatively wide upper, or trench portion $24_U$. Any exposed portions of capping layer 14 present between the upper low-k dielectric layer 15 and the lower low-k dielectric layer 13 is thinned or removed simultaneously with the removal of capping layer 12.

Next, as shown in FIG. 2(L), the dual-damascene opening 24 is then filled with an electrically conductive material, e.g., a metal material, typically of Cu or a Cu-based alloy by means of electroplating or electroless plating. Accordingly, consistent with conventional practices for performing Cu-based metallization processing, a barrier layer, such as of tantalum (Ta) or tantalum nitride (TaN), is initially deposited to line the dual-damascene opening. A seed layer, such as of a Cu alloy containing at least one of magnesium (Mg), aluminum (Al), zinc (Zn), zirconium (Zr), tin (Sn), nickel (Ni), palladium (Pd), silver (Ag), or gold (Au) each in a suitable amount, e.g., from about 0.3 to about 12 at. %, is then deposited to line the recess walls. A plug 25 of Cu or a Cu-based alloy is then deposited, as by the aforementioned electroplating or electroless plating, to fill the dual-damascene opening 24 and form a blanket layer or overburden. Planarization processing (not shown) of the thus-obtained structure, as by chemical-mechanical polishing ("CMP"), is then performed to remove the overburden and make the upper surface of the Cu plug 25 substantially co-planar with the upper surface of the upper interlayer dielectric layer 15. The resulting dual-damascene opening 24 filled with metal plug 25 comprises a Cu via 26 in electrical contact at its lower end with the lower metal feature 10 and in electrical contact at its upper end with trench 27.

While the exact mechanism for the observed elimination or substantial reduction in photoresist poisoning provided by the instant methodology is not known with certainty, and not desirous of being bound by any particular mechanism or theory, it is nonetheless believed that the hydrogen treatment of the exposed interior wall surfaces of the recesses in the low-k dielectric layer according to the invention substantially reduces the amount of nitrogen atoms/molecules present thereat, either as constituents of the low-k dielectric material or as contaminants introduced thereinto as a result of exposure to various reactive plasmas as are utilized for patterning and photoresist ashing. It is further believed that the reduced amount of nitrogen atoms/molecules at the exposed interior surfaces of the recesses formed in the low-k dielectric material is insufficient to materially affect the properties of a subsequently deposited photoresist layer by contamination thereof. As a consequence, photoresist patterning by selective removal of portions thereof can be accomplished without formation of mushroom-shaped capping portions which can degrade pattern replication and dimensional accuracy.

Moreover, hydrogen atoms included at the interior wall surfaces of the low-k dielectric layer as a result of the hydrogen treatment are available during subsequent processing for reaction with nitrogen atoms/molecules to form volatile reaction products which are readily removed from the recesses.

As a consequence of the above-described inventive methodology, high-quality, low-resistance, accurately-dimensioned electrical contacts, interconnections, and metallization patterns for use in high integration density semiconductor devices may be advantageously formed in a rapid, cost-effective manner utilizing conventional manufacturing techniques, apparatus, and instrumentalities. In addition, the inventive methodology enjoys utility in the manufacture of various other electrical and electronic devices and components wherein photoresist and dielectric layers are patterned and/or removed, as by plasma etching/ashing techniques. Finally, the invention can be practiced at rates consistent with the throughput requirements of automated manufacturing processes and is fully compatible with conventional process flow for the manufacture of semiconductor IC devices and components.

In the previous description, numerous specific details are set forth, such as specific materials, structures, reactants, processes, parameters, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes or modifications within the scope of the inventive concept as expressed herein.

What is claimed Is:

1. A method of eliminating, or at least substantially reducing, photoresist poisoning during recess patterning of a layer of a material, comprising the sequential steps of:
   (a) forming a first photoresist layer on an upper surface of said layer;
   (b) patterning said first photoresist layer to include at least one opening therein having a first width;
   (c) forming at least one first recess in said upper surface of said layer utilizing said patterned first photoresist layer as a mask, said at least one first recess having a first width substantially corresponding to said first width of said at least one opening in said first photoresist layer and extending for a first depth below said surface of said layer;
   (d) removing said first photoresist layer;
   (e) treating exposed surfaces of said layer to eliminate, or at least substantially reduce the amount of nitrogen or a nitrogen-containing contaminant which can poison a second photoresist layer subsequently formed in contact with said upper surface of said layer; and
   (f) forming a second photoresist layer on said upper surface of said layer; wherein poisoning of said second photoresist layer by entry thereinto of said nitrogen or nitrogen-containing contaminant is eliminated or at least substantially reduced due to said surface treating of step (e).

2. The method as in claim 1, further comprising the steps of:
   (g) patterning said second photoresist layer to form at least one opening therein, said at least one opening in said second photoresist layer being vertically aligned with said at least one first recess in said layer and having a second width greater than said first width; and
   (h) forming at least one second recess in an upper portion of said layer utilizing said second patterned photoresist layer as a mask, said at least one second recess having a second width substantially corresponding to said second, greater width of said at least one opening in said second photoresist layer, said at least one second recess communicating with said at least one first recess and extending for a second depth below said surface of said layer, said second depth being less than said first depth.

3. The method according to claim 2, comprising filling the first recess and the second recess with a metal.

4. The method according to claim 3, wherein step (e) comprises treating set exposed surfaces of said layer with hydrogen.

5. The method according to claim 4, wherein step (e) comprises performing said treating by contacting said exposed surfaces with hydrogen ($H_2$) gas at an elevated temperature.

6. The method according to claim 5, wherein step (e) comprises performing said treating by contacting said exposed surfaces with a hydrogen plasma.

7. The method according to claim 1, comprising performing step (f) immediately after step (e).

8. The method as in claim 1, wherein:
   step (a) comprises forming said first photoresist layer on the surface of a layer comprised of at least one low-k dielectric material having a dielectric constant less than about 3.9.

9. The method as in claim 8, wherein:
   step (a) comprises forming said photoresist layer on the surface of a layer comprised of a laminate of layers of at least one low-k dielectric material.

10. The method as in claim 9, wherein:
    step (a) comprises forming said first photoresist layer on the surface of a laminate of layers each comprised of a low-k dielectric material selected from the group consisting of hydrogen silsesquioxane-based ceramic polymers, poly(arylene) ether-based organic polymers, benzocyclobutene-based materials, aromatic hydrocarbon-based polymers carbon-doped silicon oxide, hybrid siloxane-organic polymers, nanoporous silica, halogen-doped silicon dioxides obtained from tetraethyl orthosilicate, and fluorine-doped silica glasses.

11. The method as in claim 1, wherein:
    step (c) comprises forming said at least one recess in said upper surface of said layer by an anisotropic etching process.

12. The method as in claim 11, wherein:
    step (c) comprises anisotropic etching utilizing a reactive plasma.

13. The method as in claim 1, wherein:
    step (d) comprises removing said first photoresist layer by plasma ashing.

14. The method as in claim 13, wherein:
    step (d) comprises plasma ashing said first photoresist layer in a nitrogen-containing atmosphere.

15. The method as in claim 1, wherein:
    step (e) comprises treating said exposed surfaces of said layer with hydrogen.

16. The method as in claim 15, wherein:
    step (e) comprises performing said treating by contacting said exposed surfaces with hydrogen ($H_2$) gas at an elevated temperature.

17. The method as in claims 15, wherein:
    step (e) comprises performing said treating by contacting said exposed surfaces with a hydrogen plasma.

18. The method as in claim 2, wherein:
    step (h) comprises forming said at least one second recess in said upper portion of said layer by an anisotropic etching process utilizing said patterned second photoresist layer as a mask, said etching terminating at an etch stop layer within said layer at said second depth below said surface.

19. The method as in claim 18, wherein:
    step (h) comprises anisotropic etching utilizing a reactive plasma.

20. A method of manufacturing a semiconductor device, comprising the sequential steps of:

(a) providing a workpiece comprising:
  (i) a semiconductor substrate including at least one active device region or component formed therein or thereon;
  (ii) a dielectric layer overlying said semiconductor substrate and including at least one metal feature in-laid in an upper surface of said dielectric layer;
  (iii) a thin capping layer formed over at least the upper surface of said at least one metal feature; and
  (iv) an interlayer dielectric layer formed over said thin capping layer;
(b) forming a first photoresist layer on an upper surface of said interlayer dielectric layer;
(c) patterning said first photoresist layer to include at least one opening therein having a first width;
(d) forming at least one first recess in said upper surface of said interlayer dielectric layer utilizing said patterned first photoresist layer as a mask, said at least one first recess having a first width substantially corresponding to said first width of said at least one opening in said first photoresist layer and extending through said interlayer dielectric layer to said thin capping layer;
(e) removing said first photoresist layer;
(f) treating exposed surfaces of said interlayer dielectric layer to eliminate, or at least substantially reduce the amount of nitrogen or a nitrogen-containing contaminant which can poison a second photoresist layer subsequently formed on said upper surface of said interlayer dielectric layer;
(g) forming a second photoresist layer on said upper surface of said interlayer dielectric layer, wherein poisoning of said second photoresist layer by entry thereinto of said nitrogen or nitrogen-containing contaminant is eliminated or substantially reduced due to said surface treating step (f);
(h) patterning said second photoresist layer to form at least one opening therein, said at least one opening in said second photoresist layer being vertically aligned with said at least one first recess and having a second width greater than said first width; and
(i) forming at least one second recess extending partway through said interlayer dielectric layer, said at least one second recess having a second width substantially corresponding to said second, greater width of said at least one opening in said second photoresist layer and communicating with said at least one first recess.

21. The method according to claim 20, comprising performing step (g) immediately after step (f).

22. The method as in claim 20, wherein:
step (a) comprises providing a workpiece wherein said interlayer dielectric layer (iv) further includes:
  $(iv_1)$ a first, lower interlayer dielectric layer formed over said thin capping layer;
  $(iv_2)$ a thin etch stop layer formed over said first interlayer dielectric layer; and
  $(iv_3)$ a second, upper interlayer dielectric layer formed over said thin etch stop layer.

23. The method as in claim 22, wherein:
step (a) comprises providing a workpiece wherein each of said first, lower and second, upper interlayer dielectric layers comprises a low-k dielectric material having a dielectric constant less than about 3.9, selected from the group consisting of hydrogen silsesquioxane-based ceramic polymers, poly(arylene) ether-based organic polymers, benzocyclobutene-based materials, aromatic hydrocarbon-based polymers, carbon-doped silicon oxide, hybrid siloxane-organic polymers, nanoporous silica, halogen-doped silicon dioxides obtained from tetraethyl orthosilicate, and fluorine-doped silica glasses;
step (e) comprises removing said first photoresist layer by plasma ashing in a nitrogen-containing atmosphere; and
step (f) comprises treating exposed surfaces of said first and second interlayer dielectric layers to eliminate or at least substantially reduce the amount of nitrogen thereon or thereat by contacting said surfaces with hydrogen ($H_2$) gas at an elevated temperature or with a hydrogen plasma.

24. The method as in claim 23, wherein:
step (d) comprises anisotropic etching utilizing a reactive plasma; and
step (i) comprises anisotropic etching utilizing a reactive plasma and terminating etching of said at least second recess at said thin etch stop layer.

25. The method as in claim 20, further comprising the steps of:
(j) removing said second photoresist layer;
(k) removing said thin capping layer overlying said upper surface of said at least one in-laid metal feature at the bottom of said at least one first recess; and
(l) filling said at least one first and said at least one second communicating recesses with a metal plug to form at least one electrically conductive via in contact with said at least one in-laid metal feature and at least one electrically conductive line in contact with said at least one electrically conductive via.

26. The method as in claim 20, wherein:
step (a) comprises providing a workpiece wherein said semiconductor substrate comprises silicon (Si), said at least one in-laid metal feature comprises copper (Cu) or a Cu-based alloy, and said thin capping layer comprises a silicon nitride or oxynitride.

* * * * *